United States Patent [19]
Hu et al.

[11] Patent Number: 5,838,729
[45] Date of Patent: Nov. 17, 1998

[54] MULTIPLE MODE TRELLIS DECODER FOR A DIGITAL SIGNAL PROCESSING SYSTEM

[75] Inventors: Keren Hu, Plainsboro; William Wei-Lian Lin, East Windsor; Maurice David Caldwell, Plainsboro, all of N.J.

[73] Assignee: Thomson multimedia, S.A., France

[21] Appl. No.: 629,680

[22] Filed: Apr. 9, 1996

[51] Int. Cl.$^6$ .................................................. H04N 5/46
[52] U.S. Cl. ......................... 375/265; 348/555; 371/43.4
[58] Field of Search ........................... 375/265; 348/426, 348/555; 371/43.4–43.8

[56] References Cited

U.S. PATENT DOCUMENTS

| | | | |
|---|---|---|---|
| 5,602,583 | 2/1997 | Citta | 375/265 |
| 5,666,170 | 9/1997 | Stewart | 348/432 |
| 5,671,253 | 9/1997 | Stewart | 348/555 |
| 5,717,471 | 2/1998 | Stewart | 348/726 |

OTHER PUBLICATIONS

*Digital Television Standard for HDTV Transmission*, of Apr. 12, 1995 (HDTV Standard), prepared by the US Advanced Television Systems Committee (ATSC), Containing Sections 4.2.4–4.2.6, 10.2.3.8–10l2.3.10, 4.2.6–4.2.7, 10.2.3.9–10.2.3.9–10.2.3.13, 10.3.2 –10.3.3.3 and 10.2.3.9. *TCM In The HDTV Transceiver*, by J. Kim et al. of the University of California, Los Angeles, undated.
*VSB Modulation Used For Terrestrial and Cable Broadcasts*, by G. Sgrignoli et al., published in the I.E.E.E. Transactions on Consumer Electronics, vol. 41, No. 3, Aug. 1995.

*Architectural Tradeoffs For Survivor Sequence Memory Management In Viterbi Decoders* by G. Feygin et al., published in the I.E.E.E. Transactions on Communications, vol. 41, No. 3, Mar. 1993.
Co–pending U.S. Patent Application by J.S. Stewart, Serial No. 08/501,334, filed Jul. 12, 1995, entitled *"Apparatus For Decoding Video Signals Encoded In Different Formats"*.
Co–pending U.S. Patent Application by J.S. Stewart, Serial No. 08/501,361, filed Jul. 12, 1995, entitled *"Apparatus For Demodulating And Decoding Video Signals In Different Formats"*.
Co–pending U.S. Patent Application by J.S. Stewart, Serial No. 08/50172, filed Jul. 12, 1995, entitled *"Apparatus For Demodulating and Decoding Satellite, Terrestrial And Cable Transmitted Digital Television Data"*.

*Primary Examiner*—Melvin Marcelo
*Attorney, Agent, or Firm*—Joseph S. Tripoli; Ronald H. Kurdyla; Alexander J. Burke

[57] ABSTRACT

An adaptive trellis decoder seamlessly switches between multiple operational modes. The decoder switches between multiple modes and accommodates data type transitions using a single state transition trellis with a predetermined number of states. The system decodes trellis encoded video data encoded in different formats respectively containing different numbers of levels associated with different modes. The decoder system adaptively operates in response to a configuration signal distinguishing between the modes, and employs a state transition trellis with the same number of trellis decoding states for decoding encoded data of different formats. The state transition decoding trellis may also be reset to a predetermined state in response to a synchronization signal generated as a result of a transition from one type of data to another or in response to a mode change.

21 Claims, 11 Drawing Sheets

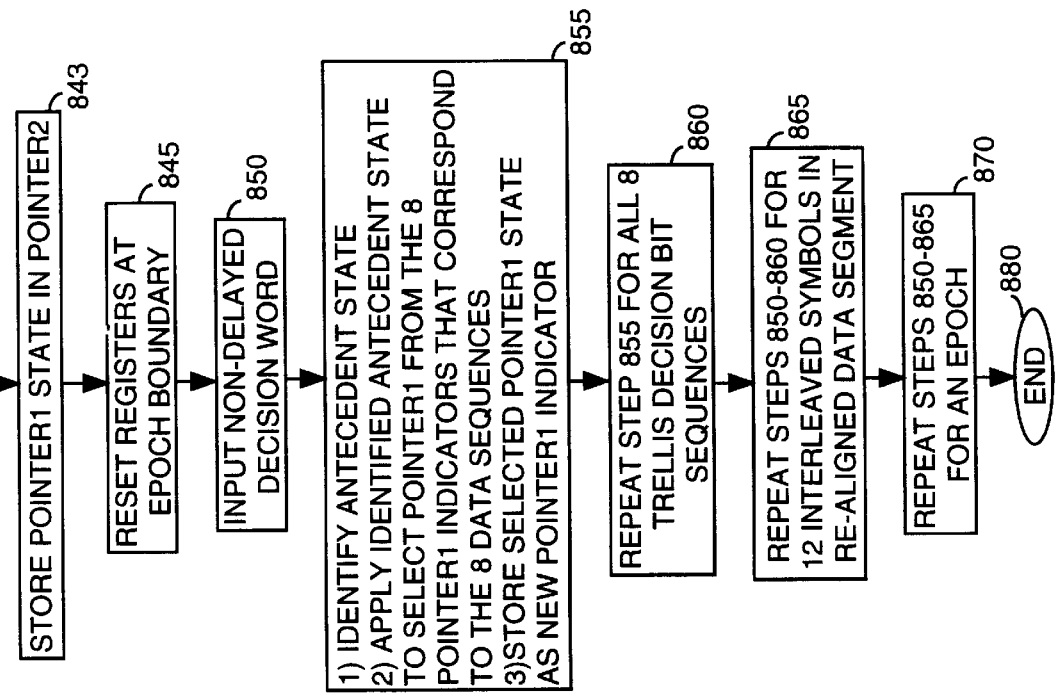
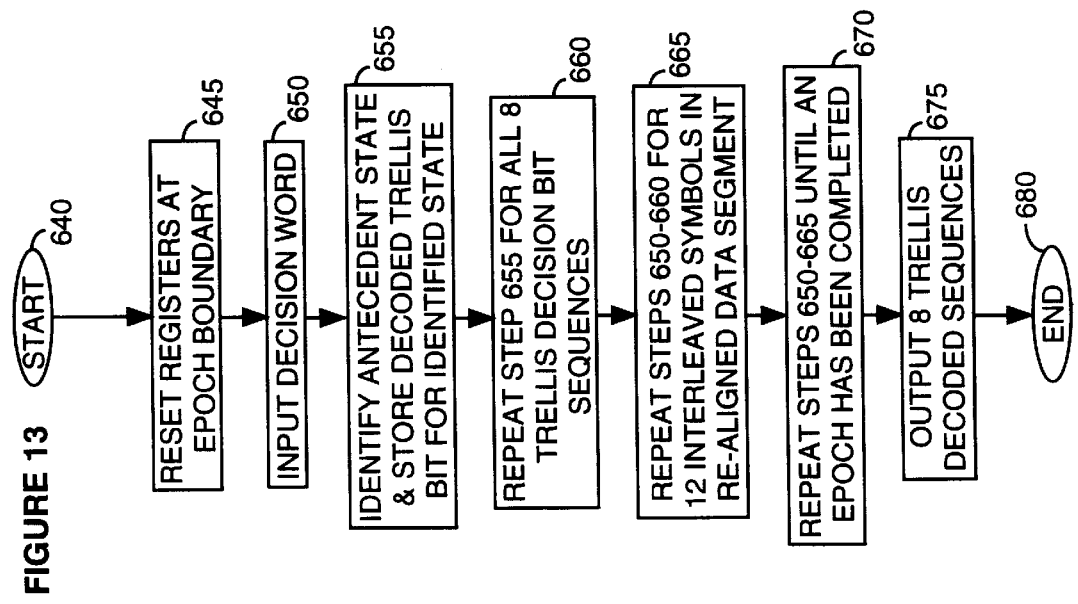

MULTIPLE MODE TRELLIS DECODER FOR A DIGITAL SIGNAL PROCESSING SYSTEM

FIELD OF THE INVENTION

This invention is related to the field of digital signal processing, and more particularly to a trellis decoder suitable for decoding multiple mode trellis encoded High Definition Television (HDTV) type signals, for example.

BACKGROUND OF THE INVENTION

In broadcast and communication applications, trellis coding is employed to improve signal noise immunity. Trellis coding is used in combination with other techniques to protect against particular noise sources. One of these techniques is data interleaving, which is used to protect against interference bursts that may occur during transmission. In this technique, data is arranged (interleaved) in a prescribed sequence prior to transmission, and the original sequence is restored (deinterleaved) upon reception. This operation spreads or disperses the data in time in a predetermined sequence, such that a data loss during transmission does not result in a loss of contiguous data. Instead, any data lost is dispersed and is therefore more easily concealed or corrected. Another technique used to provide interference immunity is interference rejection filtering, which may be used to protect a signal against data dependent cross-talk and co-channel interference.

Trellis coding requirements for high definition television in the United States are presented in sections 4.2.4–4.2.6 (Annex D), 10.2.3.9, 10.2.3.10 and other sections of the *Digital Television Standard for HDTV Transmission* of Apr. 12 1995, prepared by the United States Advanced Television Systems Committee (ATSC) (hereinafter referred to as the HDTV Standard). The HDTV Standard presents a trellis coding system that employs an interleaving function involving 12 parallel trellis encoders at a transmitter and 12 parallel trellis decoders at a receiver for processing 12 interleaved datastreams. The HDTV Standard trellis coding system also employs an interference rejection filter at a receiver decoder to attenuate cross-talk and co-channel interference associated with NTSC frequencies. The rejection filter as specified by the HDTV Standard is optional and may be applied dynamically depending on the particular data being decoded.

The use of an interleaved code or dynamically selectable filter functions together with trellis decoding introduces additional trellis decoder design constraints and operating modes. These additional design constraints and operating modes significantly complicate the design and implementation of the trellis decoding function for HDTV receiver applications, for example. In particular, complications arise when the trellis decoder is required to provide seamless switching between multiple modes, such as may occur when switching between NTSC filtered and non-filtered input data or when switching between HDTV program channels, for example. In addition, cost and hardware constraints associated with consumer HDTV receivers require an efficient cost-effective trellis decoder design. Such a cost-effective design solution would employ an efficient trellis decoder architecture capable of accommodating interleaved datastreams and multiple modes of operation.

SUMMARY OF THE INVENTION

In accordance with the principles of the present invention, a trellis decoder system incorporates an adaptive trellis decoder that seamlessly switches between different operating modes. A disclosed system uses a single decoding trellis with a predetermined number of states. The decoding trellis switches between multiple modes and accommodates transitions between different types of data.

In a system for processing a trellis encoded input video signal, a pre-processor subjects the input signal to one of a number of pre-processing modes, e.g. filtered and non-filtered modes. The pre-processor provides a processed signal exhibiting one of a number of different signal formats, e.g. partial response and normal formats, which contain different numbers of levels, e.g. 15 levels or 8 levels, and are associated with different modes. A trellis decoder decodes the processed signal to provide trellis decoded output data. The trellis decoder employs a state transition trellis with the same number of trellis states for decoding processed signals of different signal formats.

In accordance with a feature of the invention, the decoder includes a control network for generating a synchronization signal in response to a data type transition or a mode change. The decoder also employs a state transition coding trellis that resets to a predetermined state in response to the synchronization signal.

BRIEF DESCRIPTION OF THE DRAWINGS

In the drawing:

FIG. 13 shows a flowchart for a process for performing a trellis traceback function used in the trellis decoding of interleaved data, according to the invention.

FIG. 14 shows a flowchart for a forward trace process used in the trellis decoding of interleaved data, according to the invention.

DETAILED DESCRIPTION OF THE DRAWINGS

Figure 1:
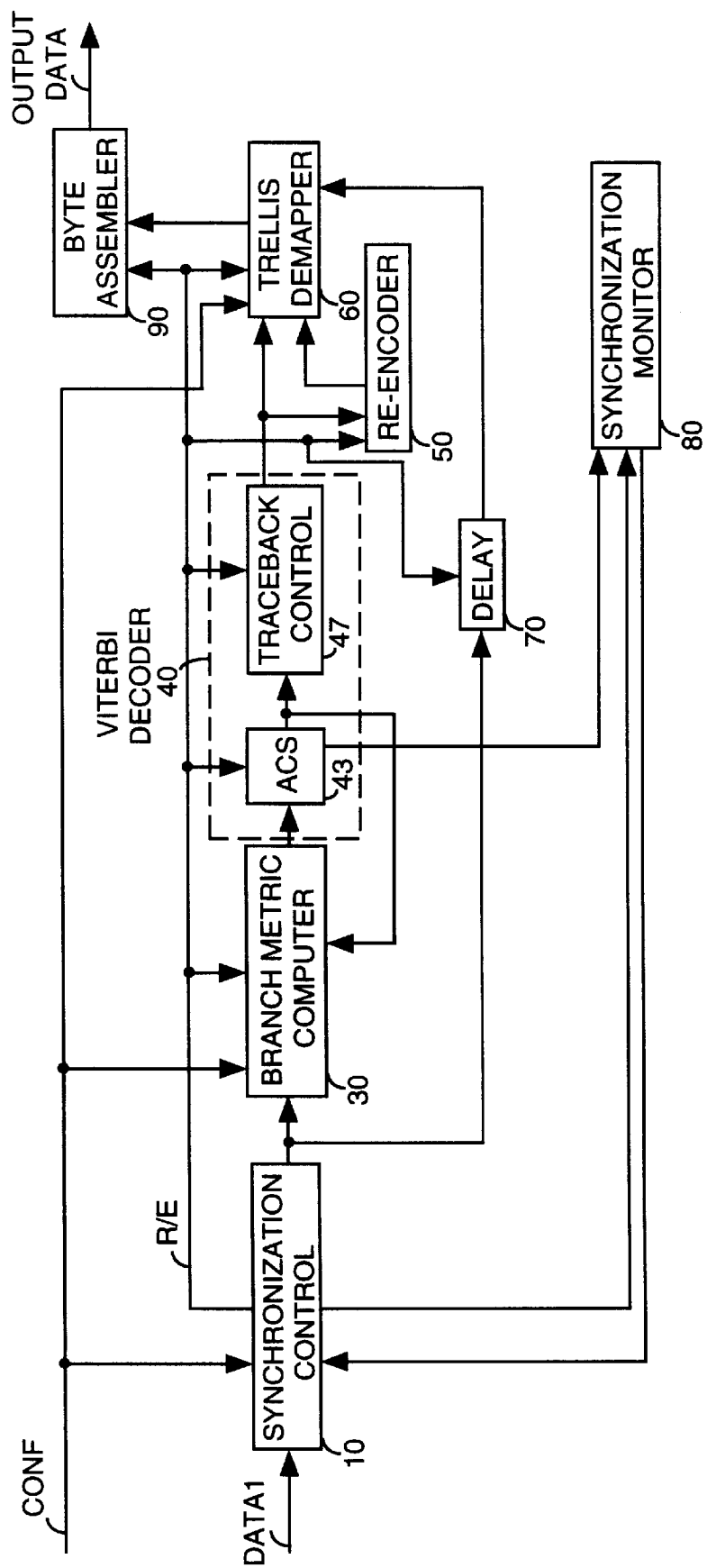
FIG. 1 shows a trellis decoder system according to the invention for decoding multiple interleaved datastreams and for providing seamless switching between multiple operating modes.

FIG. 1 shows a video receiver trellis decoder system 24, according to the invention, for decoding multiple interleaved datastreams such as data encoded according to the HDTV Standard, for example. The system adaptively decodes datastreams that are pre-processed into a plurality of formats (e.g. a normal 8-level format and a partial response 15-level format), and that are also pre-processed in one of a plurality of modes (filtered or non-filtered modes). The system also provides seamless Viterbi decoder switching between the filtered and non-filtered data modes. In addition, decoder 24 of FIG. 1 uses a single adaptive trellis decoder function rather than a plurality of parallel trellis decoders as portrayed in the HDTV Standard.

Although the disclosed system is described in the context of an HDTV receiver system, it is exemplary only. The disclosed system may be used in other types of communication systems. The system may also be used in other types of operating modes involving other types of pre-processing modes and functions, other types of filter functions and various data interleaving methods as well as other ways of enhancing signal noise immunity.

In overview, in FIG. 1, trellis encoded input data DATA1 from a demodulator (not shown) is input to synchronization control unit 10. DATA1 is in the form of a binary data sequence of data symbols as known where each symbol is represented by an assigned digital value. The set of symbols is represented in a complex plane as a set of points called a signal constellation, as known. Unit 10 detects Field and Segment synchronization signals within DATA1. A data Field comprises a plurality of segments, each of which contains a plurality of data packets. These synchronization signals are defined by the HDTV Standard in sections 10.2.3.9–10.2.3.13 and sections 4.2.6–4.2.7 (Annex D). Unit 10 uses these detected sync signals to re-align DATA1 and to provide output re-aligned data to branch metric computer (BMC) 30 and to delay unit 70. Synchronization control unit 10 also generates register reset and register enable signals, R/E, that are used to reset and synchronize decoder 24 of FIG. 1 at power-on, upon the occurrence of an out of sync condition, or in response to another input such as a global system reset, for example. Unit 10 also generates the R/E signals in response to an out-of-sync signal from synchronization monitor 80 as will be discussed later. In addition, an input signal CONF is used to configure FIG. 1 system elements to decode either filtered or non-filtered data. The CONF signal indicates whether or not DATA1 has been pre-filtered by an NTSC co-channel interference rejection filter. The CONF signal may be provided by a control processor (not shown to simplify the drawing) that communicates with the FIG. 1 elements for controlling the overall system functions, or it may be provided as a discrete signal from a source indicating filter presence, for example. The use of the rejection filter will be further discussed in connection with FIG. 12.

Branch metric computer 30 computes a set of values (metrics) for each received data symbol. The metrics represent the proximity of a received symbol to the other points in the set that comprise the symbol constellation. The computed metrics are output to code sequence detection system 40 which employs the known Viterbi decoding algorithm. The code sequence detection system, is described in the context of an exemplary Viterbi decoding system implemented using Add-Compare-Select (ACS) unit 43 and traceback control unit 47. ACS unit 43 performs a series of repetitive add-compare-select operations using the metrics from unit 30 to provide a sequence of decision bits to traceback control unit 47 and unit 30. The decision bits output by ACS unit 43 indicate the result of the add-compare-select operations on the metrics from unit 30. Traceback unit 47 uses the decision bits from unit 43 to determine for the received data symbols the most likely corresponding sequence of bits that would have been encoded by the encoder. In addition, an input decision bit from unit 43 is used in filtered mode to select between branch metric computation signal paths within the unit 30 architecture. Synchronization monitor 80 determines whether the re-aligned data output from unit 10 has been correctly synchronized by evaluating metric values from one of the add-compare-select computation units within ACS unit 43. Monitor 80 generates an out-of-sync signal for use by unit 10 and other receiver elements based on this metric value evaluation.

Traceback unit 47 outputs a sequence of trellis decoded decision bits to trellis demapper 60 and re-encoder 50. Unit 50 re-encodes the sequence of bits from unit 47 to provide a re-encoded bit sequence to demapper 60. In addition, re-aligned data from unit 10, delayed by unit 70, is provided to trellis demapper 60. Trellis demapper 60 uses the input data from units 47, 50 and 70 both to identify the transmitted data symbol, and to recover the corresponding original encoded data. The resulting recovered original data from demapper 60 is assembled into data bytes by assembler 90 and output to other receiver elements as required.

The detailed operation of the trellis decoder 24 of FIG. 1 will now be discussed. In this regard it is noted that Viterbi decoding, branch metric computation and trellis coding are known and generally described, for example, in the reference text *Digital Communication*, Lee and Messerschmidt (Kluwer Academic Press, Boston, Mass., USA, 1988).

Figures 2, 3:
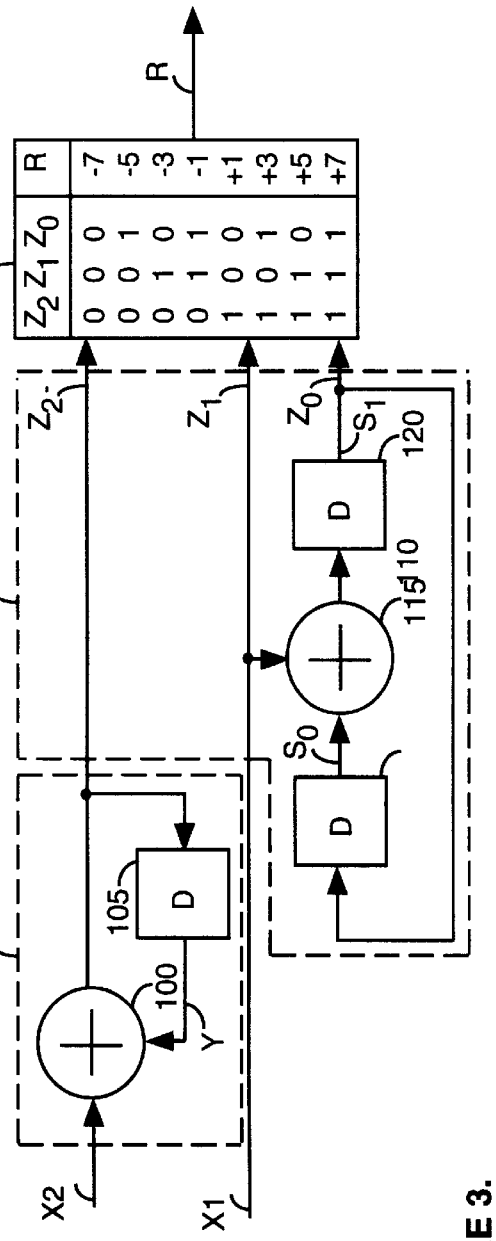
FIG. 2 shows a trellis encoder, pre-coder and symbol mapper as described in the HDTV Standard.
FIG. 3 is an encoder state table derived for the encoder system of FIG. 2.

The DATA1 input signal to trellis decoder 24 is encoded according to the HDTV Standard (section 4.2.5 of Annex D and other sections) using the encoding function depicted in FIG. 2. FIG. 2 shows that two input data bits X1 and X2 are encoded as three bits Z2, Z1 and Z0. Each three bit word corresponds to one of the 8 symbols of R. For this purpose X2 is processed by pre-coder 102, comprising filter components adder 100 and register 105, to provide encoded bit Z2, as known. X1 is encoded as two bits Z1 and Z0, as known, by trellis encoder 103 comprising adder 115 and registers 110 and 120. The output data words from the FIG. 2 encoder function are mapped into a sequence of data words or symbols, R, of decimal values as indicated by mapper 125 in FIG. 2. The operation of the encoder of FIG. 2 is illustrated by the accompanying state transition table of FIG. 3.

The data output R from the encoder of FIG. 2 represents a symbol constellation comprising 8 points or levels in 4 cosets. The coset values are: coset A=(A−, A+)=(−7, +1); coset B=(B−, B+)=(−5, +3); coset C=(C−, C+)=(−3, +5); and coset D=(D−, D+)=(−1, +7). This mapping is arbitrary. Other mappings, such as the 16 level mapping mentioned for cable operation in HDTV Standard section 5.1, may also be used. The data encoded in this form is modulated onto a carrier and transmitted to an HDTV receiver.

Figure 12:
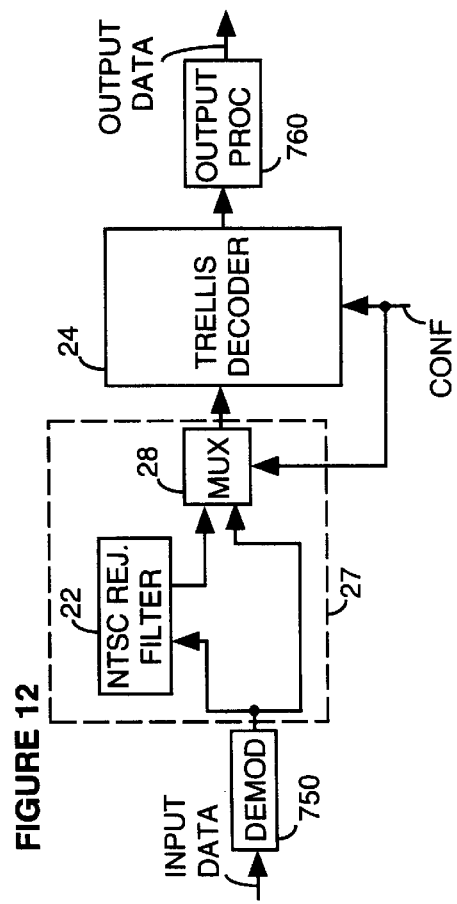
FIG. 12 shows a seamlessly switchable trellis decoder, according to the invention, that adaptively decodes multiple interleaved datastreams of either filtered or non-filtered data, in the context of an HDTV receiver system.

In an HDTV receiver context as shown in FIG. 12, Vestigial Side Band (VSB) modulated encoded data is applied to input processor and demodulator unit 750 as will be discussed later. The demodulated data is pre-processed by a pre-processor 27 comprising NTSC co-channel interference rejection filter 22 and mux 28 before being trellis decoded. In pre-processor 27 of FIG. 12, either demodulated data from unit 750 or demodulated data from unit 750 filtered by NTSC rejection filter 22 is selected by mux 28 in response to the CONF signal. The selected data from mux 28 is decoded by trellis decoder 24. Data that is not pre-filtered by unit 22 prior to trellis decoding has a data format containing 8 encoded levels further modified by any noise or interference occurring in the communication process, as known. However, data that is pre-filtered by unit 22 prior to trellis decoding has a data format containing 15 encoded levels also modified by any noise or interference occurring in the communication process, as known.

In the filtered mode when rejection filter 22 is used, an eight state trellis decoder is required, and in the non-filtered mode when filter 22 is not used, a four state trellis decoder is required, as known. Trellis decoder system 24 (FIG. 1) advantageously incorporates a single eight state trellis architecture and seamlessly switches between modes. Decoder 24 provides seamless switching both for the optional filter modes and for data interruptions resulting from program changes and other types of transitions, for example. Trellis decoded and intra-segment symbol deinterleaved data output by decoder 24 is provided to unit 760. The symbol deinterleaved data from decoder 24 is then further processed by output processor 760 before being passed to other HDTV receiver elements for processing and display, as will be discussed later.

The seamless switching capability of trellis decoder 24 results both from the decoder architecture and from the design of the individual decoder elements. A key feature of the architecture of decoder 24 is that it incorporates a single eight state ACS unit (unit 43) for both filtered and non-filtered data input modes. This permits Viterbi decoder 40 to transparently decode filtered or non-filtered data irrespective of the state of the CONF configuration signal. The inventors have recognized that an eight state ACS unit may be used to mimic the four state ACS architecture required for the non-filtered mode. This is because BMC unit 30 performs parallel equivalent computations to provide replicated branch metric values to ACS unit 43 in the non-filtered mode. The disclosed ACS structure not only emulates the desired four state ACS architecture when it is provided with the input replicated values, but also enables ACS unit 43 to operate the same way in filtered and non-filtered modes. Another feature of decoder 24 is that it incorporates an adaptive architecture responsive to input configuration signal CONF. The CONF signal indicates whether or not the decoder 24 input data is filtered by the NTSC rejection filter. These features permit decoder 24 to seamlessly operate between the filtered and non-filtered modes associated with the optional use of the NTSC filter.

Control unit 10 detects the HDTV Standard compatible Field and Segment synchronization signals in input DATA1. The Field and Segment sync signals are not trellis encoded or pre-coded. Therefore the sync signals may be detected using known techniques as discussed in HDTV Standard sections 10.2.3.9 and 10.3.2–10.3.3.3. These sync signals are used within unit 10 to buffer and re-align the data contained in DATA1 and to provide output re-aligned data segments, stripped of the sync information, to BMC unit 30 and to delay unit 70. The data is re-aligned by sequentially storing the data in buffer registers, or equivalent memory, followed by outputting the data from the registers with the non-data sync packets omitted. The non-data packets may be removed either prior to or after storage. The encoded re-aligned data output from unit 10 is in the form of successive segments. Each segment contains successive sequential packets of the 12 interleaved datastreams (SP1–SP12). Each packet contains one encoded data symbol as defined in the HDTV Standard. Neither the successive segments nor the successive packets contain intervening synchronization intervals. Alternative data re-alignment methods may be used. For example, instead of detecting and removing the sync intervals, decoder 24 may detect the sync intervals and disable or hold the decoder 24 functions in a known state using reset and register enable signals for the duration of the sync intervals.

Control unit 10 also generates Reset/Enable signals, R/E, that are used to reset and synchronize decoder 24. The R/E signals are generated at both power-on and in response to a signal from synchronization monitor 80 indicating an out-of-sync data condition. The R/E signals may also be generated in response to an external input signal such as a global system reset or program change indication signal, for example. The architecture of decoder 24 permits re-synchronizing the trellis decoding operation in response to the R/E signals. This re-synchronizing ability enables the single trellis decoding function of decoder 24 to provide seamless switching both for the optional filter modes and for data interruptions, i.e. switching that is unobjectionable to a viewer.

Control unit 10 also detects filtered data mode using the CONF signal and in this mode incorporates a further function to correct data corruption caused by the NTSC rejection filter. The data corruption occurs in the four symbol packets that occur twelve symbol intervals after the Segment sync. In filtered data mode, the co-channel rejection filter subtracts an encoded data symbol of the previous data segment from a collocated (i.e. the same relative symbol packet) encoded data symbol of the current data segment. This operation produces partial response input data (HDTV Standard sections 10.2.3.8 and 10.2.3.9). However, when a sync interval (four symbols in duration) precedes four symbol packets by twelve symbol intervals, the subtraction is corrupted. This is because sync values and not collocated symbol values are subtracted from these four symbol packets. Therefore unit 10, in filtered data mode, identifies the four symbol packets occurring twelve symbols after the segment sync interval. In addition, unit 10 adds back the stored sync values subtracted in the rejection filter and subtracts the stored correct symbol packet data (the four collocated symbol packets that precede the segment sync). In this manner, unit 10 provides a corrected partial response re-aligned data output to units 30 and 70 in filtered data mode. A similar method of correcting the partial response data is suggested in section 10.2.3.9 and FIG. 10.12 of the HDTV Standard.

Figure 6:
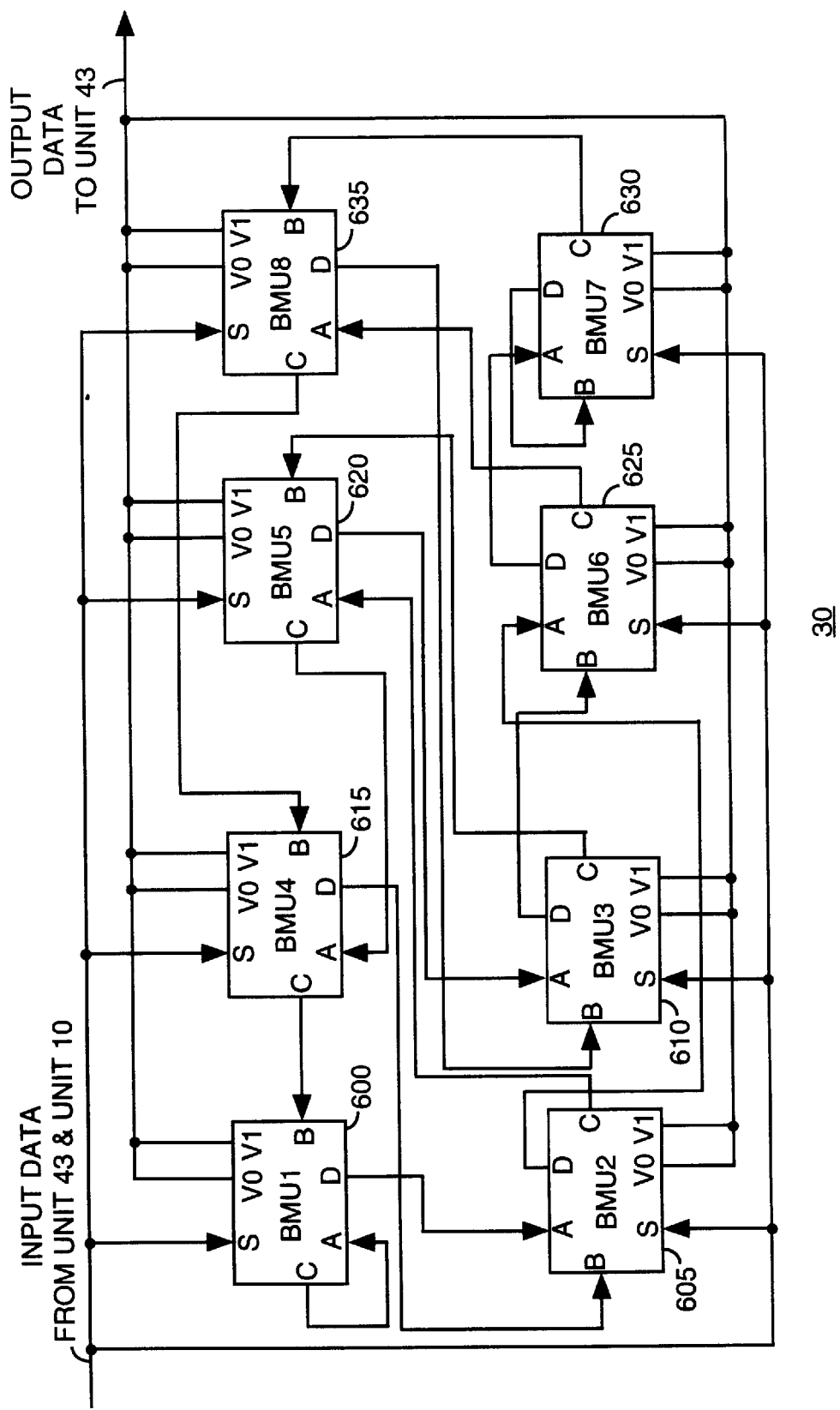
FIG. 6 is a block diagram showing a branch metric computer architecture, according to the invention, suitable for use in the trellis decoder of FIG. 1.
Figure 7:
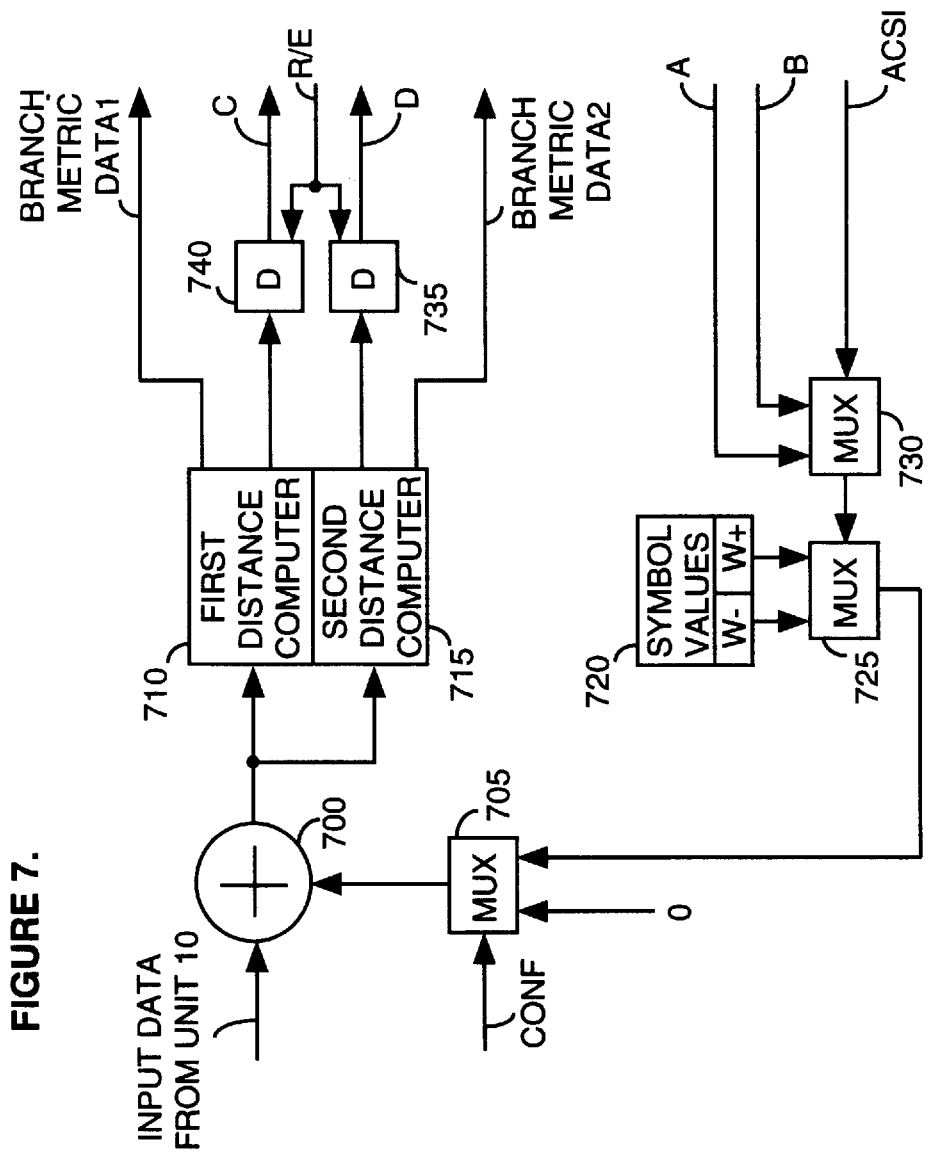
FIG. 7 is a diagram showing a branch metric computation unit architecture, according to the invention, suitable for use in the branch metric computer architecture of FIG. 6.

Branch metric computer 30 computes values (metrics) for each encoded interleaved re-aligned symbol received from unit 10. The computed metrics are Viterbi decoded by unit 40 which incorporates Add-Compare-Select (ACS) unit 43 and traceback control unit 47. FIG. 6 shows the architecture of the branch metric computer (BMC) unit 30 of FIG. 1. FIG. 7 shows the architecture of an individual BMC unit of FIG. 6 and is representative of each of the BMU1–BMU8 units (units 600–635). The input data provided to the S inputs of units BMU1–BMU8 of FIG. 6 includes the interleaved symbol data from unit 10 and inputs from the ACS unit 43 (FIG. 1). The symbol data and ACS inputs (ACSI) are separately identified in FIG. 7 as inputs to units 700 and 730 respectively.

The BMC unit of FIG. 7 sequentially processes the encoded interleaved symbol sequence from unit 10. In a non-filtered data mode as selected by the CONF signal, input symbol data of a first interleaved symbol in the data from unit 10 is passed unaltered by adder 700. In this mode multiplexer (mux) 705 outputs a zero value to adder 700. First and second distance computers 710 and 715 compute the Euclidian geometrical distance of the encoded input symbol from first and second cosets respectively and provide two corresponding metric value outputs, Branch Metric Data1 and Branch Metric Data2. Table I defines the coset computation performed by each BMU unit distance computer e.g. for BMU1 proximity to cosets A and C respectively are computed. Also, first and second distance computers 710 and 715 each provide, via registers 740 and 735, output bits C and D. Bits C and D indicate which one of the two values within each of the first and second cosets the input symbol is closest to. Registers 740 and 735 each comprise serially connected individual one bit registers through which bits C and D are cyclically shifted, respectively. In this manner output bits C and D for each of the 12 interleaved symbols from unit 10 (FIG. 1) are sequentially output from registers 740 and 735. The distance computer is typically implemented using look-up tables but may also be implemented by other methods such as by computing distances with subtraction, absolute value and comparison operations, for example.

TABLE I

| | COSET DEFINITION | | |
|---|---|---|---|
| BMU unit | First Distance Computer | Second Distance Computer | Coset W |
| BMU1 | A | C | A |
| BMU2 | B | D | C |
| BMU3 | B | D | A |
| BMU4 | A | C | C |
| BMU5 | C | A | B |
| BMU6 | D | B | D |
| BMU7 | D | B | B |
| BMU8 | C | A | D |

In the filtered data operating mode, input symbol data of a first interleaved symbol in the data from unit 10 is summed by adder 700 with either coset value W+ or coset value W− from unit 720 via muxes 725 and 705. The summed data is processed by distance computers 710 and 715 as explained before. Coset values W+ and W− belong to one of the four previously defined cosets A–D. The particular W+ and W− coset value which is used in an individual BMU unit is selected from the four defined cosets for that particular BMU unit as defined in Table I. The W+ and W− coset is chosen to restore the modified input symbol data from unit 10 to symbol data that can be processed by the distance computers 710 and 715. This operation is required in the filtered mode since the combination of interleaving and co-channel rejection filtering produces partial response input data as previously mentioned and not the normal symbol data produced in the non-filtered mode (HDTV Standard sections 10.2.3.8 and 10.2.3.9). Mux 730 via mux 725 determines whether W+ or W− is summed in adder 700 with the modified input data based on the state of the ACSI input decision bit from ACS unit 43 and the state of bit input signals A and B. The ACSI input decision bit from unit 43 determines whether input A or input B selects between the W+ and W− values that are summed by adder 700. For example, if ACSI=1, input B is selected by mux 730 and if B=1, W+ is selected by mux 725 to be added in adder 700 via mux 730. The A and B input interconnections are shown in FIG. 6, for example, A and B for unit BMU4 are provided by BMU5 and BMU6 respectively (FIG. 6). The remaining operation of the BMC unit of FIG. 7 in the filtered mode is the same as the operation described for the non-filtered mode.

BMC unit 30 of FIG. 1 similarly sequentially processes the remaining interleaved symbols of a re-aligned data segment from unit 10. After completely processing a re-aligned data segment, BMC unit 30 repeats the described process starting with the first interleaved data symbol packet of the next re-aligned data segment from unit 10.

The interconnection of the individual identical BMU units (BMU1–BMU8) is shown in the overall BMC architecture in FIG. 6. Interleaved symbol data from unit 10 is input to the S inputs of units BMU1–BMU8 and is processed by each of these interconnected units as described for the exemplary unit of FIG. 7. The resulting Branch Metric Data1 and Branch Metric Data2 outputs on terminals V0 and V1 of units BMU1–BMU8 are provided to ACS unit 43 (FIG. 1). ACS unit 43 of FIG. 1 performs a series of repetitive add-compare-select operations using the Branch Metric Data1 and Branch Metric Data2 outputs from each of the BMU units of unit 30.

Figure 4:
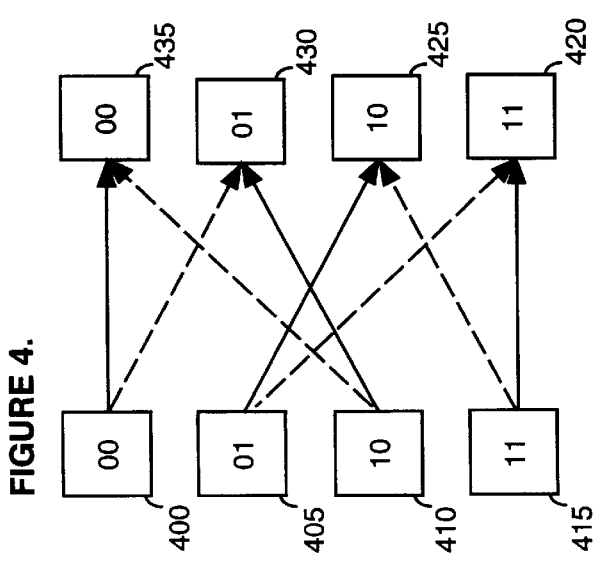
FIG. 4 is a four state trellis diagram derived for trellis decoding data that has not been pre-filtered by an NTSC co-channel rejection filter.
Figure 9:
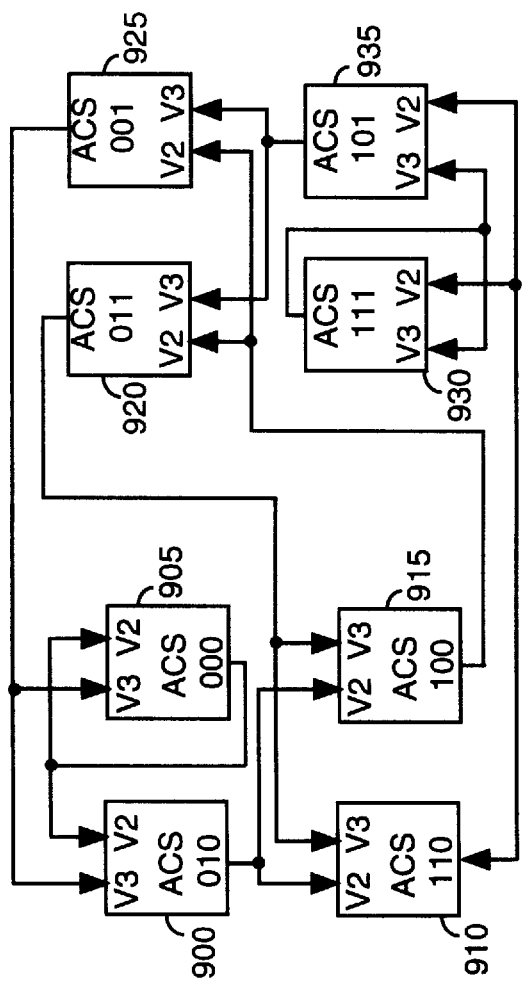
FIG. 9 is a diagram showing an ACS function architecture, according to the invention, suitable for use in the trellis decoder of FIG. 1.

FIG. 9 shows the interconnections between the individual ACS units that comprise the overall ACS architecture of unit 43 of FIG. 1. In FIG. 9 a single eight state ACS architecture is used for both filtered and non-filtered data input modes. The FIG. 9 ACS architecture implements the filtered mode eight state transition diagram of FIG. 5. Each ACS unit (units 900–935) is associated with a trellis state (000 . . . 111). The four state transition diagram of FIG. 4 shows the equivalent trellis state transitions for the non-filtered mode. Re-ordering of the states shown in the state transition diagram of FIG. 5 further clarifies the interconnections shown in FIG. 9.

Figure 8:
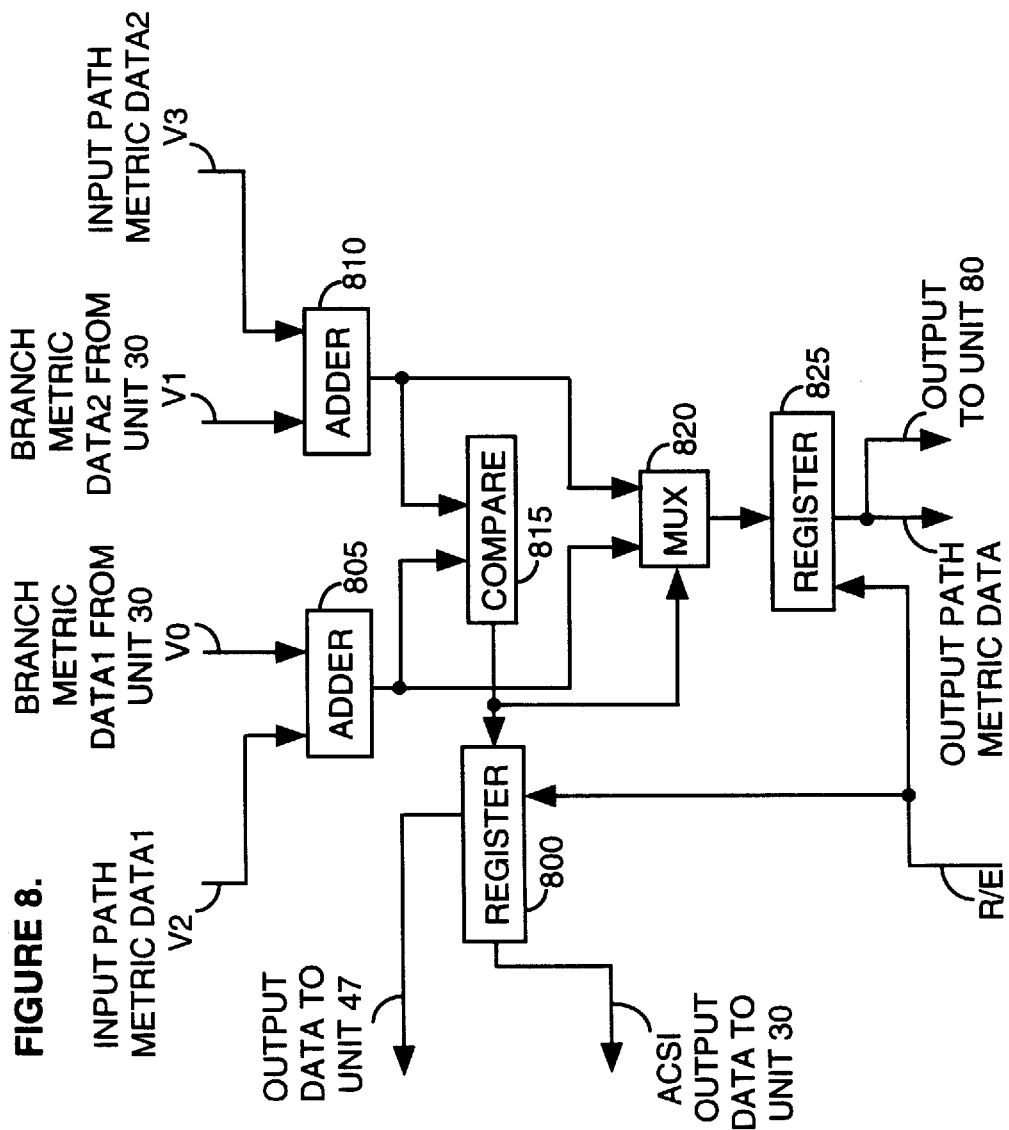
FIG. 8 is a diagram showing an architecture of an individual Add-Compare-Select (ACS) unit, according to the invention, suitable for use in the ACS function architecture of FIG. 9.

FIG. 8 shows the architecture of an individual ACS unit representative of each of the FIG. 9 ACS units (units 900–935). The FIG. 9 ACS architecture sequentially processes the branch metric data for the individual interleaved data symbols from unit 30 (FIG. 1). Adders 805 and 810 of FIG. 8 sum input Path Metric Data1 and input Path Metric Data2 obtained from other ACS units with the Branch Metric Data1 and Branch Metric Data2 outputs for an interleaved data symbol from BMU unit 30 (FIG. 1). The two resultant data sums from units 805 and 810 are compared by unit 815. A single decision bit output indicating which of the two sums is the smaller is output by unit 815 to register 800 and to mux 820. Mux 820 selects the smaller sum from the outputs of units 805 and 810. This selected sum appears as Output Path Metric Data at the output of register 825.

Register 800 comprises twelve serially connected individual one bit registers through which the decision bit output from unit 815 is cyclically shifted. The decision bit output provided as the ACSI output to unit 30 (FIG. 1) follows a twelve cycle delay by register 800. The decision bit output provided to traceback control unit 47 (FIG. 1) follows a single cycle delay by register 800. In this manner each single decision bit output associated with each of the 12 interleaved symbols is sequentially output from register 800. Similarly, register 825 comprises serially connected individual registers through which the Output Path Metric Data from unit 820 is cyclically shifted. In this manner the Output Path Metric Data associated with each of the 12 interleaved symbols is sequentially output from register 825. The bit width of the serially connected registers within unit 825 is selected in accordance with ACS unit processing resolution requirements.

The Output Path Metric Data from register 825 is provided to two other ACS units in accordance with the interconnection diagram of FIG. 9. For example, the Output Path Metric Data from ACS unit 900 of FIG. 9 is provided to the input Path Metric Data1, V2, inputs of ACS units 910 and 915. Similarly, input Path Metric Data1 and input Path Metric Data2 provided to adders 805 and 810 of FIG. 8 are provided by two other ACS units in accordance with the interconnection diagram of FIG. 9. For example, the Input Path Metric Data1, V2, input of ACS unit 900 is provided by ACS unit 905 and the input Path Metric Data2, V3, input of ACS unit 900 is provided by ACS unit 925. The sequence of decision bits indicating the result of the sequence of add-compare-select operations on the metrics from unit 30 (FIG. 1) are output from register 800 of FIG. 8 to traceback control unit 47 following a single cycle delay and to unit 30 (FIG. 1) following a twelve cycle delay. Each of the eight ACS units of unit 43 provides a sequence of decision bits to units 47 and 30. Eight decision bits are cyclically output in parallel from unit 43 to units 47 and 30 for each of the interleaved symbol packets provided by unit 10. BMC unit 30 and ACS unit 43 (FIG. 1) are interconnected as indicated in Table II. Units 30 and 43 are shown in FIGS. 6 and 9, respectively.

TABLE II

| OUTPUT | CONNECTED TO INPUT |
|---|---|
| BMU1-V0 | V0-ACS unit 905 |
| BMU1-V1 | V0-ACS unit 900 |
| BMU2-V0 | V0-ACS unit 915 |
| BMU2-V1 | V0-ACS unit 910 |
| BMU3-V0 | V1-ACS unit 915 |
| BMU3-V1 | V1-ACS unit 910 |
| BMU4-V0 | V1-ACS unit 905 |
| BMU4-V1 | V1-ACS unit 900 |
| BMU5-V0 | V0-ACS unit 925 |
| BMU5-V1 | V0-ACS unit 920 |
| BMU6-V0 | V0-ACS unit 935 |
| BMU6-V1 | V0-ACS unit 930 |
| BMU7-V0 | V1-ACS unit 935 |
| BMU7-V1 | V1-ACS unit 930 |
| BMU8-V0 | V1-ACS unit 925 |
| BMU8-V1 | V1-ACS unit 920 |
| ACSI unit 900 | BMU2-ACSI |
| ACSI unit 905 | BMU1-ACSI |
| ACSI unit 910 | BMU6-ACSI |
| ACSI unit 915 | BMU5-ACSI |
| ACSI unit 920 | BMU3-ACSI |
| ACSI unit 925 | BMU4-ACSI |
| ACSI unit 930 | BMU7-ACSI |
| ACSI unit 935 | BMU8-ACSI |

In the non-filtered mode, there are a maximum of four distinct branch metric values for a given received non-filtered symbol. Also, in this mode BMC unit 30 performs sixteen parallel computations to provide sixteen branch metric values to ACS unit 43, and a single computation is replicated four times. Therefore, the sixteen values provided to unit 43 include replications of the four distinct branch metric values. The replication of the branch metric values that are input to unit 43 enables the architecture of ACS unit 43 (FIG. 9) to emulate the desired four state ACS trellis of FIG. 4. Note, in practice, branch metric values are substantially, rather than perfectly, replicated by BMC unit 30 due to system noise.

Figure 5:
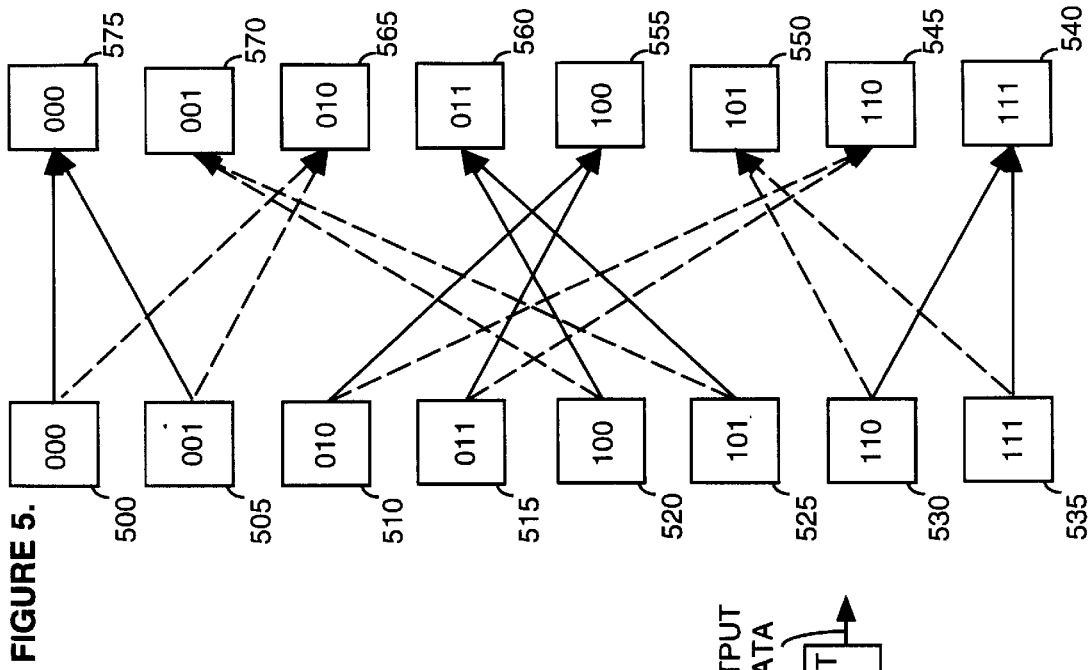
FIG. 5 is an eight state trellis diagram derived for trellis decoding data that has been pre-filtered by an NTSC rejection filter.

In the filtered mode, BMC unit 30 (FIG. 1) generates a maximum of fifteen distinct branch metric values for each input symbol and operates according to the eight state ACS trellis of FIG. 5. The use of a single eight state ACS architecture, as shown in FIG. 9, for both filtered and non-filtered input modes facilitates the seamless and transparent transition of trellis decoder 24 between the modes.

The Most Significant Bit (MSB) of the Output Path Metric Data from register 825 (FIG. 8) of one of the ACS units (units 900–935 of FIG. 9) is also provided to synchronization monitor 80 (FIG. 1). Synchronization monitor 80 counts the number of inversions in the MSB from register 825 that occur in a programmed time interval, and compares the count against a programmed threshold value. The programmed value may be provided by a control processor (not shown) or stored in unit 80. If the count exceeds the threshold value, an out-of-sync indication signal is generated and provided to Synchronization control unit 10 (FIG. 1). Upon receipt of an out-of-sync signal from unit 80, unit 10 provides a reset signal to unit 80 to reset the synchronization monitor to permit detection of another out-of-sync condition. Monitor 80 may be alternatively arranged to respond to different parameters.

The architecture of ACS unit 43 provides decision bit data to traceback unit 47 (FIG. 1) organized both by interleaved data symbol and by ACS unit trellis state. Traceback unit 47 cyclically receives eight decision bits in parallel (B1–B8, one 8 bit word) from the corresponding eight ACS units of unit 43 for each of the encoded interleaved symbols provided by unit 10. One eight bit word is cyclically received per interleaved symbol. The received decision words represent eight sequences of decision bits from the corresponding eight ACS units of unit 43. Unit 47 sequentially processes each decision word from unit 43 associated with an individual interleaved data symbol. Decision words are used by unit 47 to produce the most likely sequence of Z1 bits representing the interleaved symbol sequence previously encoded at the transmitter. Each decision bit identifies which of the two possible state transition paths lead to an ACS unit state.

Figure 10:
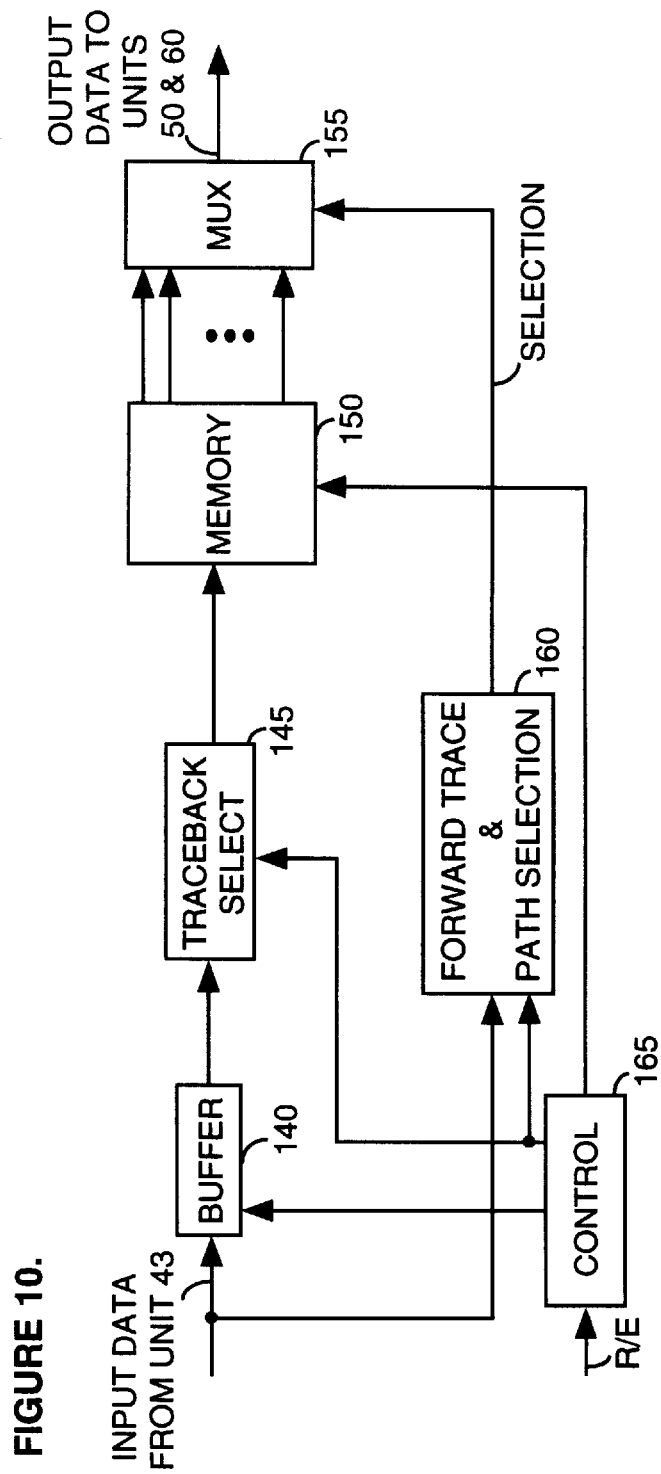
FIG. 10 is a diagram showing a traceback control unit architecture, according to the invention, suitable for use in the trellis decoder of FIG. 1.

FIG. 10 shows the architecture of Traceback Control unit 47 (FIG. 1). The operation of traceback unit 47 will be described for decision words associated with a sequence of encoded interleaved symbols output by ACS unit 43. The traceback architecture of FIG. 10 implements the trellis decoding process depicted in FIG. 15. In step 443 of FIG. 15, following the start at step 440, decision words are cyclically input in the form of eight decision bit sequences from ACS unit 43 (FIG. 1). The input decision words are provided to forward trace unit 160 (FIG. 10) and, in step 445, are also stored and delayed in buffer memory 140 (FIG. 10). In step 450, traceback select unit 145 of FIG. 10 derives eight trellis decoded bit sequences from the decision bit sequences stored in unit 140. These trellis decoded bit sequences are candidates for the most likely encoded Z1 bit sequence corresponding to the encoded interleaved data symbols.

Figure 15:
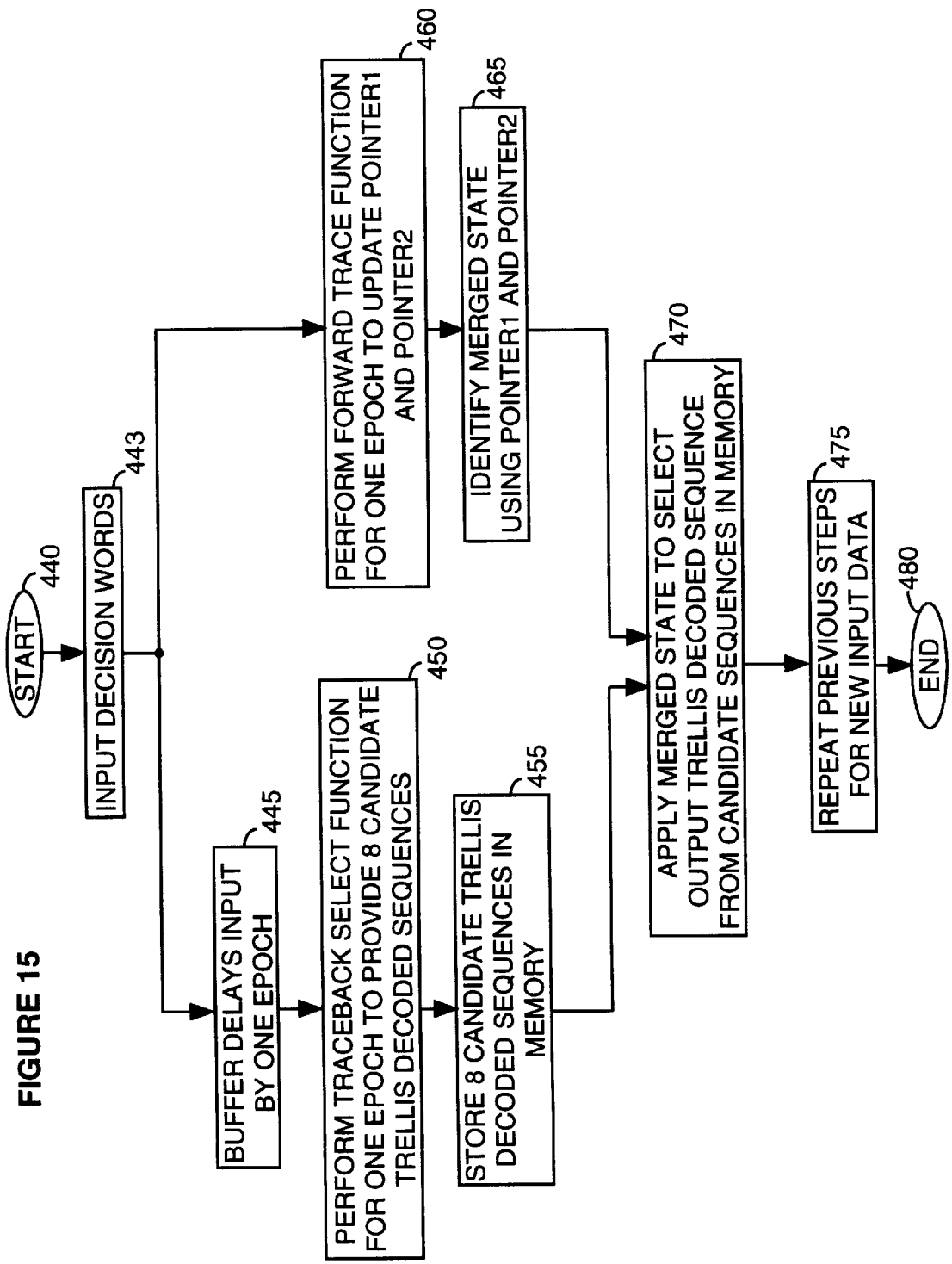
FIG. 15 shows a trellis decoding process, incorporating the FIG. 13 and FIG. 14 processes, that implements the FIG. 10 traceback control function, according to the invention.

In step 450 of FIG. 15, unit 145 (FIG. 10) derives the candidate decoded Z1 bit sequences by determining state transition trellis paths in a traceback process. In this process, an initial antecedent trellis state is identified for the current state of one of the eight decision bit input sequences. This initial state is identified by using a decision bit from ACS unit 43 (FIG. 1) in the input sequence as an indicator of an antecedent transition path. From this initial antecedent state, other antecedent states are identified by traversing the trellis state transition diagram in reverse direction using the decision bits from ACS unit 43 until a sequence of antecedent states has been identified. From this sequence of antecedent states a corresponding sequence of trellis decoded bits is determined. These steps are repeated for each of the remaining sequences of decision bits stored in buffer 140 (FIG. 10).

The theory behind the traceback process is known and is described with other different traceback methods in *Architectural Tradeoffs for Survivor Sequence Memory Management in Viterbi Decoders* by G. Feygin et al published in the I.E.E.E. Transactions on Communications, vol. 41, No. 3, March 1993.

The described traceback process is performed to a predetermined depth T, the traceback depth, to identify a predetermined number of antecedent states. In accordance with known theory, traceback interval T is adopted in practice as a sufficient interval of traceback to identify a merged or converged state (Lee and Messerschmidt, section 7.4.3). The merged state is the state that is likely to be reached following traceback from any initial antecedent trellis state. The merged state identifies the data sequence with the greatest likelihood of being the true encoded Z1 data. Therefore, the merged state indicates the trellis decoded data sequence that is to be output from the candidate sequences. The traceback process, in the exemplary embodiment, is performed in two stages for traceback intervals, termed Epochs, equal to T/2. The selection of such Epochs or sub-traceback intervals is arbitrary and selectable by a system designer.

In order to identify the candidate decoded trellis sequences, traceback is performed on collocated interleaved symbol packets of successive re-aligned data segments. Traceback on one of the twelve interleaved symbol packets, for example packet seven (SP7), is performed to identify antecedent states for symbol data in the corresponding prior, here seventh (SP7), interleaved symbol packets.

Although traceback on a single trellis path is known, the disclosed system advantageously extends the traceback process to encompass traceback for interleaved data and for a plurality of candidate decision bit sequences. This extended traceback process is performed on an Epoch by Epoch basis using the method of FIG. 13 which is implemented by unit 145 of FIG. 10. In step 645 of FIG. 13, following the start at step 640, internal storage registers within traceback select unit 145 are initialized at an Epoch data boundary in response to control signals from control unit 165 (FIG. 10). A decision word for an interleaved symbol packet, e.g. SP1, is cyclically input at step 650 from buffer 140 (FIG. 10). An antecedent state is identified from the current state in step 655 by applying the previously described traceback process using a decision bit, e.g. B1, of the decision word input in step 650. A key feature of the process is that the antecedent state is identified for symbol data of collocated interleaved packets of successive data segments. For example, for the seventh interleaved symbol packet (SP7) of a data segment, a corresponding seventh interleaved symbol packet decision bit is used to identify an antecedent state. In step 655 a trellis decoded bit corresponding to the identified antecedent state of the interleaved symbol is stored in memory 150 by unit 145 (FIG. 10).

Step 660 repeats step 655 for each of the remaining decision bits (B2–B8 in the example) of the input decision word until eight trellis decoded bits for the interleaved symbol have been stored in memory 150 (FIG. 10). In step 665, steps 650–660 are repeated for each of the remaining twelve interleaved symbols (SP2–SP12 in the example) of a re-aligned data segment. Similarly, steps 650–665 are repeated in step 670 for the number of re-aligned data segments that comprise an Epoch interval. In step 675, the resulting eight candidate trellis decoded bit sequences for the input interleaved symbols are provided by unit 145 to memory 150 of FIG. 10. This iteration of the traceback process for one Epoch interval ends at step 680 of FIG. 13 and completes step 450 of the encompassing process of FIG. 15.

In steps 460 and 465 of FIG. 15, forward trace unit 160 (FIG. 10) identifies the trellis decoded bit sequence in the eight candidate sequences that most likely corresponds to the sequence that was encoded and transmitted to the receiver. In step 470, the resulting identified trellis decoded sequence, following a delay, is provided by memory 150 to trellis demapper 60 and re-encoder 50 (FIG. 1) via mux 155 in response to a selection signal from trace unit 160.

In steps 460 and 465 of FIG. 15, trace unit 160 identifies the merged state and the trellis decoded bit sequence that most likely corresponds with the transmitted interleaved symbol packet sequence. Trace unit 160 identifies the trellis decoded bit sequence on an Epoch by Epoch basis using the forward trace process shown in FIG. 14. The forward trace technique is a cost-effective method of reducing data decoding delay (latency).

In step 460 of FIG. 15, the FIG. 14 forward trace process is performed for an Epoch interval of input data to update two pointers, pointer1 and pointer2, for each of the eight data sequences. These pointers are used to identify the trellis decoded bit sequence.

In step 843 of FIG. 14, following the start at step 840, the eight pointer2 indicators are updated with corresponding pointer1 indicator values. These pointers are stored within unit 160. In step 845, internal storage registers within unit 160 are initialized at an Epoch data boundary in response to control signals from control unit 165 (FIG. 10). Control unit 165 provides control signals in response to the R/E input signals from unit 10 (FIG. 1) for synchronizing both trace units 145 and 160 to start tracing at an Epoch boundary. A non-delayed decision word for an interleaved symbol packet, e.g. SP1, is cyclically input at step 850 from ACS unit 43 (FIG. 1).

In step 855, a three stage procedure is used to update one of eight separate pointer1 indicators that are associated with the eight data sequences of the input decision words. A decision bit, e.g. B1, of the input non-delayed word is used to identify an antecedent state from the current state by applying the previously described traceback process. The antecedent state is identified for symbol packet data of a collocated interleaved symbol packet (SP1 in the example) of a preceding data segment as described for the traceback process of unit 145. The identified antecedent state is used to select one of the eight separate pointer1 indicators that are associated with the eight data sequences of the input decision words. The state indicated by the selected pointer1 of the interleaved symbol (SP1 of the example) is stored in the pointer1 indicator associated with the decision bit sequence (the sequence for B1 in the example) overwriting any previous pointer1 contents.

Step 860 repeats step 855 for each of the remaining decision bits of the input decision word (bits B2–B8 of the example) until separate pointer1 indicators for each of the eight data sequences are stored in unit 160 for the interleaved symbol (SP1). In step 865, steps 850–860 are repeated for the remaining interleaved symbols (symbols SP2–SP12 in the example) of a twelve symbol re-aligned data segment. Similarly, step 870 repeats steps 850–865 until the number of re-aligned data segments that comprise an Epoch interval (I/2) have been processed. This iteration of the forward trace process ends at step 880 of FIG. 14 and completes step 460 of the encompassing process of FIG. 15.

In step 465 of FIG. 15, the updated pointers, pointer1 and pointer2, are used to identify the merged state. Following a traceback interval T, in steady state operation, both pointer1 and pointer2 for a particular data sequence, indicate the antecedent state occurring one Epoch ago. Pointer1 is the current Epoch pointer and pointer2 is the immediately prior Epoch pointer. Together, pointer1 and pointer2 point back one traceback interval T to a converged or merged antecedent state. Pointer1 and pointer2 for all eight data sequences should, in the absence of error, indicate the same merged state and hence identify the same data sequence for release from memory 150. One of the pointer1 indicators for the eight data sequences is selected and used to identify one of the eight pointer2 indicators. In turn, this identified pointer2 indicator is used to identify the merged state. Therefore, one of the eight pointer1 indicators in conjunction with one of the eight pointer2 indicators are used for identification. However, it is also possible that the pointers may be averaged or chosen on a majority or other basis to improve confidence in the merged state selection.

The merged state determined in step 465 is used in step 470 to indicate which one of the eight candidate trellis decoded bit sequences is to be released from memory 150 via mux 155 (FIG. 10). The selected decoded data sequence is the data that most likely corresponds with the transmitted encoded interleaved symbol sequence.

The resulting identified trellis decoded sequence, following a delay, is released by memory 150 to trellis demapper 60 and re-encoder 50 (FIG. 1) via mux 155 (FIG. 10) in response to a selection signal from trace unit 160. The released trellis decoded sequence output from mux 155 to trellis demapper 60 and re-encoder 50 (FIG. 1) reproduces the original sequence of X1 bits of the interleaved symbols that were encoded by the encoder of FIG. 2. Note, the X1 bit sequence is equal to the Z1 bit sequence as shown in FIG. 2. The steps of the FIG. 15 process are repeated as long as there is available input decision data. The process otherwise terminates at step 480.

Unit 50 (FIG. 1) sequentially re-encodes the interleaved Z1 sequence of bits from unit 47 (and mux 155 of FIG. 10) to provide a re-encoded Z0 bit sequence to demapper 60. The re-encoding function used to produce Z0 from Z1 duplicates the equivalent function performed in the encoder prior to transmission, as depicted in FIG. 2. In addition, re-aligned interleaved symbol data from unit 10, delayed and synchronized to the output of unit 47 by unit 70, is provided to trellis demapper 60.

Figure 11:
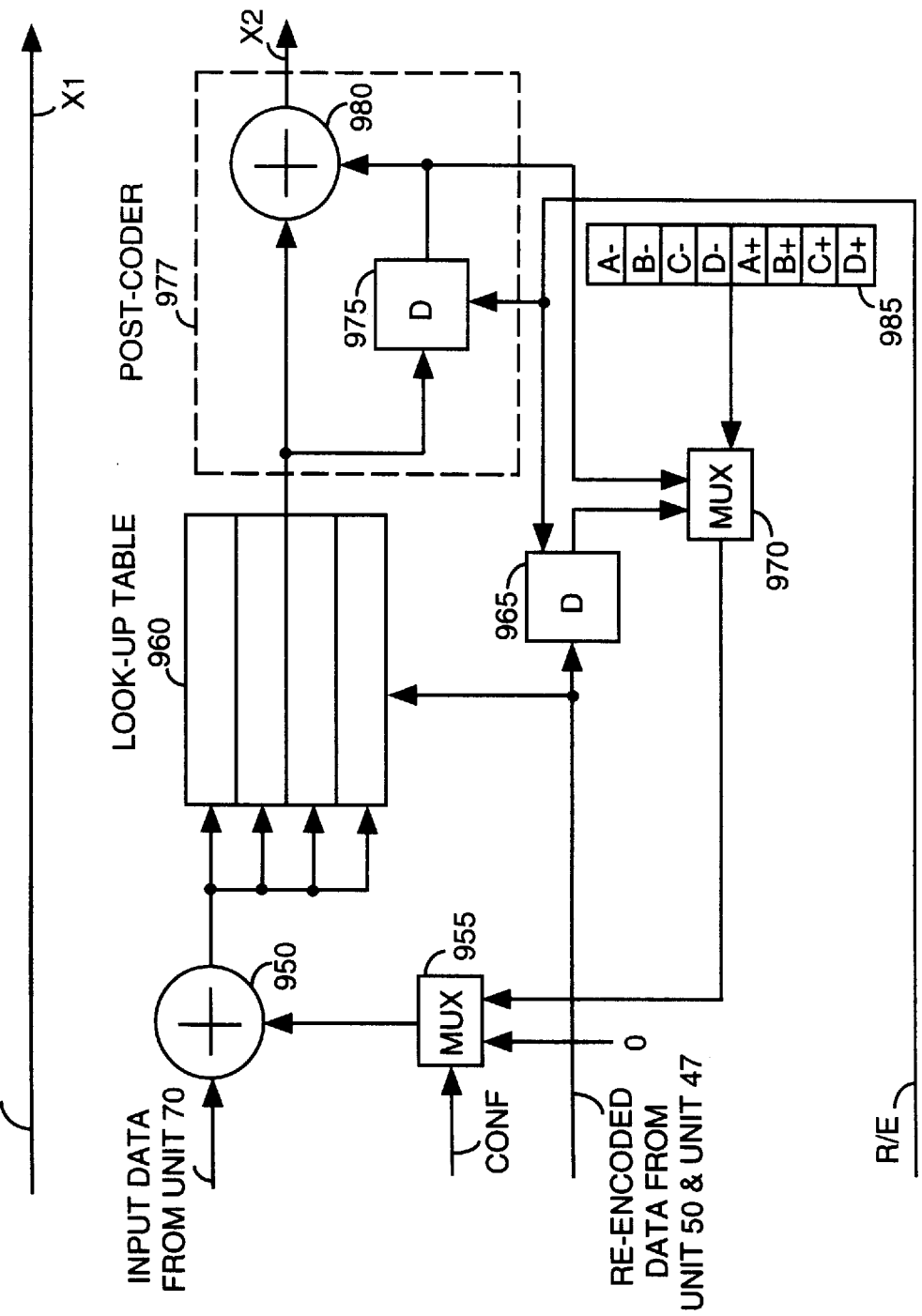
FIG. 11 is a diagram showing a trellis demapper architecture, according to the invention, suitable for use in the trellis decoder of FIG. 1.

FIG. 11 shows the architecture of trellis demapper 60 (FIG. 1). Trellis demapper 60 sequentially processes the synchronized interleaved data sequences from units 47, 50 and 70 (FIG. 1). In non-filtered data mode as selected by the CONF signal, input delayed symbol data of a first interleaved symbol from unit 70 is passed unaltered by adder 950 of the demapper unit of FIG. 11. In this mode mux 955 outputs a zero value.

Input re-encoded data Z1 and Z0 from units 50 and 70 for the first interleaved symbol uniquely define one of the four cosets previously described, as indicated in symbol mapper table 125 of FIG. 2. For example, Z1=1, Z0=0, defines coset point C (−3, +5). Look-up table function 960 of FIG. 11 compares the input symbol output from adder 950 with each of the two constellation points in the coset defined by inputs Z1 and Z0. The constellation point closest to the received delayed symbol point is determined and the Z2 value of this constellation point is provided to post-coder 977 as the decoded Z2 value for the first interleaved symbol. Post-coder 977 uses adder 980 and register 975 to provide the inverse function of pre-coder 102 of FIG. 2, and to decode the Z2 value to give an X2 bit for the first interleaved symbol. Demapper 60 repeats this process for each interleaved symbol packet received from unit 70 using synchronized associated symbol data from units 47 and 50. In this manner a sequence of X2 bits for the interleaved symbols from unit 70 (FIG. 1) corresponding to the interleaved symbols input to decoder 24 are sequentially output from adder 980.

In the filtered data mode, modified and delayed symbol packet data for the first interleaved symbol from unit 70 (FIG. 1) is summed by adder 950 of FIG. 11 with one of the eight constellation point (symbol) values from unit 985 via muxes 955 and 970. The summed data is processed by look-up table 960 as explained before. The constellation point value selected from unit 985 is chosen to restore the symbol data input to adder 950 to symbol data that can be processed by unit 960. This operation is required in the filtered mode, as explained previously, because the combination of interleaving and rejection filtering produces partial response input data (HDTV Standard section 10.2.3.9). Mux 970 via mux 955 selects the constellation point (A− . . . D+) based on the state of the Z0 and Z1 data delayed by register 965 and the state of the Z2 output from function 960 delayed by register 965. Otherwise, the filtered mode operation of demapper 60 is the same as described for the non-filtered mode.

Demapper 60 (FIG. 1) provides the resulting recovered X2 data together with synchronized X1 data to assembler 90. An X1 bit and an X2 bit corresponding to each interleaved data symbol that is input to decoder 24 are sequentially provided by unit 60 to assembler 90. Each X1, X2 bit pair is the trellis decoded data for a symbol packet. Assembler 90 assembles four X1, X2 bit pairs for collocated interleaved packets of successive data segments into one eight bit byte. Unit 90 assembles data bytes in this way for each of the twelve interleaved symbol packets. Unit 90 outputs the bytes on a byte by byte basis for each of the twelve interleaved symbol packet streams. In this manner unit 90 provides intra-segment symbol deinterleaved output data for use by remaining receiver elements.

In an exemplary HDTV receiver system shown in part in FIG. 12, encoded data is processed and demodulated by processor and demodulator 750. Unit 750 includes an input channel tuner, RF amplifiers, an IF (Intermediate Frequency) amplifier and mixer stage, for down converting the modulated signal to a lower frequency band suitable for further processing. Input processor 750 also includes an automatic gain control network, analog to digital converter, and timing and carrier recovery networks. The received signal is demodulated to baseband by the carrier recovery network within unit 750. The carrier recovery network may employ equalizer, rotator, slicer and phase error detector networks as well as a phase controller for controlling the equalizer and rotator operation, as known.

Either the demodulated data or the demodulated data processed by NTSC rejection filter 22 is selected by mux 28 in response to the CONF signal and decoded by decoder 24, according to the invention. Trellis decoded and intra-segment symbol deinterleaved data output by decoder 24 is provided to unit 760. Symbol deinterleaved data from decoder 24 is convolutionally inter-segment deinterleaved and Reed-Solomon decoded by output processor 760 before being passed to other HDTV receiver elements for further processing and display. The intra-segment deinterleaving process associated with trellis coding is distinct and different from the inter-segment deinterleaving process (HDTV Standard sections 10.2.3.9 and 10.2.3.10). The functions discussed in connection with units 750 and 760 are described, for example in the Lee and Messerschmidt text previously mentioned, among others.

The architectures discussed with respect to FIGS. 1–15 are not exclusive. Other architectures may be derived in accordance with the principles of the invention to accomplish the same objectives. For example, either a single trellis decoder may be used to decode N packets of input data, or more than one trellis decoder may be used (e.g. less than N) depending on the requirements of a particular system. In addition, architecture may be devised with different numbers of trellis transition states. The principles of the invention are not restricted to the described eight state architecture. Further, the functions of the elements of the various architectures may be implemented in whole or in part within the programmed instructions of a microprocessor.

What is claimed is:

1. In a system, for processing a trellis encoded video input signal, apparatus comprising:
   a pre-processing network for subjecting said input signal to one of a plurality of pre-processing modes to provide a processed signal exhibiting one of a plurality of signal formats, said formats being associated with said modes; and
   a trellis decoder for decoding said processed signal, wherein said trellis decoder employs a state transition trellis with the same number of trellis states for decoding processed signals of a plurality of signal formats from said pre-processing network.

2. A system according to claim 1, wherein said plurality of signal formats exhibit respectively different numbers of levels.

3. A system according to claim 1, wherein said plurality of signal formats include normal response and partial response signal formats.

4. A system according to claim 1, wherein said system provides a configuration signal distinguishing between said modes; and
   said trellis decoder adaptively trellis decodes said processed signal in response to said configuration signal.

5. A system according to claim 1, wherein said state transition trellis has eight trellis states.

6. A system according to claim 1, including
   a control network for generating a synchronization signal in response to a data type transition in said input signal; and wherein
   said state transition trellis resets to a predetermined state in response to said synchronization signal.

7. A system according to claim 1, wherein said trellis decoder includes
   a branch metric computer for providing branch metric values in response to said processed signal.

8. A system according to claim 7, wherein said branch metric computer values include a substantially replicated value in one of said modes.

9. A system according to claim 7, wherein said branch metric computer values include different numbers of substantially replicated branch metric values in different modes.

10. A system according to claim 7, wherein said trellis decoder includes
    a Viterbi decoder for providing a Viterbi decoded output in response to said branch metric values.

11. A system according to claim 7, wherein said trellis decoder includes
    a comparison network for comparing said branch metric values to provide a decision representative output.

12. In a system for processing trellis encoded video data in different modes, said encoded data being subject to data type transitions including transitions resulting from data interruptions and mode changes, a decoding network comprising:
    a control network for generating a synchronization signal in response to a data type transition; and
    a trellis decoding network for trellis decoding said encoded data, wherein
    said decoding network employs a state transition trellis that resets to a predetermined state in response to said synchronization signal.

13. A system according to claim 12, wherein
    said system provides a configuration signal distinguishing between said modes; and
    said trellis decoding network adaptively trellis decodes said encoded data in response to said configuration signal.

14. A system according to claim 12, wherein
    said state transition trellis has eight trellis states.

15. A system according to claim 12, wherein said trellis decoding network includes
    a branch metric computer for providing branch metric values in response to said encoded data.

16. A system according to claim 15, wherein
    said branch metric computer values include a substantially replicated value in one of said modes.

17. A system according to claim 16, wherein
    said branch metric computer values include different numbers of substantially replicated branch metric values in different modes.

18. A system according to claim 15, wherein said trellis decoding network includes
    a Viterbi decoder for providing a Viterbi decoded output in response to said branch metric values.

19. A system according to claim 15, wherein said trellis decoding network includes
    a comparison network for comparing said branch metric values to provide a decision representative output.

20. In a system, for processing a trellis encoded video input signal, a method comprising the steps of:
    pre-processing said input signal by one of a plurality of pre-processing modes to provide a processed signal exhibiting one of a plurality of signal formats, said formats being associated with said modes; and
    trellis decoding said processed signal in accordance with a state transition trellis with the same number of trellis states for trellis decoding processed signals of a plurality of signal formats.

21. In a system for processing trellis encoded video data in different modes, said encoded data being subject to data type transitions including transitions resulting from data interruptions and mode changes, a method comprising the steps of:
    generating a synchronization signal in response to a data type transition; and
    trellis decoding said encoded data in accordance with a state transition trellis that resets to a predetermined state in response to said synchronization signal.

* * * * *

UNITED STATES PATENT AND TRADEMARK OFFICE
CERTIFICATE OF CORRECTION

PATENT NO.   : 5,838,729
DATED        : Nov. 17, 1998
INVENTOR(S)  : Keren Hu; William Wei-Lian Lin It is certified that error appears in the above-identified patent and that said Letters Patent is hereby corrected as shown below:

On cover page, References Cited, Other Publications "Co-pending U.S. Patent Application by J.S. Stewart, Serial No. 08/50172" should read --Co-pending U.S. Patent Application by J.S. Stewart, Serial No. 08/501,752--

Signed and Sealed this

Sixteenth Day of March, 1999

Attest:

Q. TODD DICKINSON

*Attesting Officer*   *Acting Commissioner of Patents and Trademarks*